(12) United States Patent
Jo et al.

(10) Patent No.: US 9,236,455 B2
(45) Date of Patent: Jan. 12, 2016

(54) THIN FILM TRANSISTOR SUBSTRATE AND METHOD OF MANUFACTURING THE SAME

(71) Applicant: Samsung Display Co., Ltd., Yongin, Gyeonggi-Do (KR)

(72) Inventors: Jung-Yun Jo, Namyangju-si (KR); Sung-Hoon Yang, Seoul (KR); Ki-Seong Seo, Seoul (KR); Jin-Ho Hwang, Osan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 23 days.

(21) Appl. No.: 14/081,160

(22) Filed: Nov. 15, 2013

(65) Prior Publication Data

US 2015/0014677 A1 Jan. 15, 2015

(30) Foreign Application Priority Data

Jul. 10, 2013 (KR) .................. 10-2013-0080743

(51) Int. Cl.
*H01L 29/00* (2006.01)
*H01L 29/66* (2006.01)
*H01L 29/786* (2006.01)

(52) U.S. Cl.
CPC .... *H01L 29/66969* (2013.01); *H01L 29/66742* (2013.01); *H01L 29/7869* (2013.01); *H01L 29/78603* (2013.01); *H01L 29/78618* (2013.01); *H01L 29/78696* (2013.01)

(58) Field of Classification Search
CPC ............... H01L 29/7869; H01L 29/66742; H01L 29/78618; H01L 29/78603
See application file for complete search history.

(56) References Cited

U.S. PATENT DOCUMENTS

| | | | |
|---|---|---|---|
| 6,586,838 B2 | 7/2003 | Fujiki et al. | |
| 7,799,582 B2 | 9/2010 | Udayakumar et al. | |
| 7,838,351 B2 | 11/2010 | Toyota et al. | |
| 7,940,345 B2 | 5/2011 | Yamazaki | |
| 8,389,991 B2 | 3/2013 | Morosawa et al. | |
| 2004/0099926 A1 | 5/2004 | Yamazaki et al. | |
| 2009/0057672 A1* | 3/2009 | Kobayashi et al. | 257/59 |
| 2009/0315026 A1* | 12/2009 | Jeong et al. | 257/43 |
| 2011/0198606 A1* | 8/2011 | Oda et al. | 257/72 |
| 2011/0309355 A1 | 12/2011 | Ichijo et al. | |
| 2012/0319116 A1 | 12/2012 | Ono et al. | |
| 2013/0015437 A1* | 1/2013 | Yamazaki | 257/43 |

FOREIGN PATENT DOCUMENTS

| | | |
|---|---|---|
| JP | 2007-200976 A | 8/2007 |
| KR | 1020050055357 A | 6/2005 |
| KR | 1020110064701 A | 6/2011 |

* cited by examiner

*Primary Examiner* — Ngan Ngo
(74) *Attorney, Agent, or Firm* — Cantor Colburn LLP

(57) ABSTRACT

A thin film transistor substrate includes an active pattern which is disposed on a base substrate and includes a channel, a source electrode and a drain electrode, the channel which includes an oxide semiconductor, the source electrode and the drain electrode connected the channel, a gate electrode overlapped with the channel, a passivation layer which covers the source electrode, the drain electrode and the gate electrode and a fluorine deposition layer disposed between the active pattern and the passivation layer.

7 Claims, 11 Drawing Sheets

THIN FILM TRANSISTOR SUBSTRATE AND METHOD OF MANUFACTURING THE SAME

This application claims priority to Korean Patent Application No. 10-2013-0080743, filed on Jul. 10, 2013, and all the benefits accruing therefrom under 35 U.S.C. §119, the contents of which are incorporated by reference herein in their entireties.

BACKGROUND

1. Field

Exemplary embodiments of the invention relate to thin film transistor substrate and a method of manufacturing the thin film transistor. More particularly, exemplary embodiments of the invention relate to a thin film transistor substrate including an oxide semiconductor, and a method of manufacturing the thin film transistor.

2. Description of the Related Art

A thin film transistor is used for various electronic devices such as a flat panel display. The thin film transistor is used as a switching device or a driving element in the flat panel display including a liquid crystal display, an organic light emitting diode display, an electrophoretic display or the like, for example.

The thin film transistor includes a gate electrode, a source electrode, a drain electrode and a channel layer providing a channel between the source electrode and the drain electrode. The channel layer includes a semiconductor layer including amorphous silicon, polycrystalline silicon, oxide semiconductor or the like.

Amorphous silicon has a relatively low electron mobility, which may be about 1 square centimeters per volt second ($cm^2/V \cdot s$) to about 10 cm2/V·s so that a thin film transistor including amorphous silicon has relatively low driving characteristics. In contrast, polycrystalline silicon has a relatively high electron mobility, which may be about 10 $cm^2/V \cdot s$ to about hundreds $cm^2/V \cdot s$. However, a crystallization process is added for forming polycrystalline silicon. Thus, it is difficult to form a uniform polycrystalline silicon layer on a large-sized substrate and manufacturing costs are high.

Oxide semiconductor may be formed by a low-temperature process, and may be formed easily large-scaled, and has high electron mobility. Thus, the thin film transistor including the oxide semiconductor has been being researched and developed actively.

SUMMARY

One or more exemplary embodiment of the invention provides a thin film transistor ("TFT") substrate capable of improving electrical characteristics of an oxide semiconductor.

One or more exemplary embodiment of the invention further provides a method of manufacturing a TFT substrate.

According to an exemplary embodiment of the invention, a TFT substrate includes an active pattern disposed on a base substrate and including a channel, a source electrode and a drain electrode, the channel including an oxide semiconductor, the source electrode and the drain electrode being connected the channel, a gate electrode overlapped with the channel, a passivation layer covering the source electrode, the drain electrode and the gate electrode and a fluorine deposition layer disposed between the active pattern and the passivation layer.

In an exemplary embodiment, the source electrode and the drain electrode may include a metal reduced from an oxide semiconductor.

In an exemplary embodiment, the channel, the source electrode and the drain electrode may be disposed in and/or on a same layer.

In an exemplary embodiment, the passivation layer may include silicon nitride fluoride (SiNF).

In an exemplary embodiment, the oxide semiconductor may include at least one selected from zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

In an exemplary embodiment, the active pattern is plasma-treated using a gas including fluorine to provide the fluorine deposition layer.

In an exemplary embodiment, the gas including fluorine may include at least one selected from silicon tetrafluoride (SiF4), tetrafluoromethane (CF4), sulfur hexafluoride (SF6), octafluorocyclobutane (C4F8) and nitrogen trifluoride (NF3).

In an exemplary embodiment, the fluorine deposition layer may be disposed on the surface of the source electrode and the drain electrode contacting with the passivation layer.

According to another exemplary embodiment of the invention, a TFT substrate includes a gate electrode disposed on a base substrate, a first insulation layer disposed on the gate electrode, an active pattern disposed on the first insulation layer and including an oxide semiconductor, an etch stopper disposed on the active pattern, a source electrode and a drain electrode partially overlapped with the etch stopper and a fluorine deposition layer disposed on the active pattern to contact with the etch stopper.

In an exemplary embodiment, the oxide semiconductor may include at least one selected from zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

In an exemplary embodiment, the etch stopper may include silicon oxide fluoride (SiOF) or silicon nitride fluoride (SiNF).

In an exemplary embodiment, the fluorine deposition layer may be provided by plasma-treating the active pattern, the plasma-treating using a gas including at least one selected from silicon tetrafluoride (SiF4), tetrafluoromethane (CF4), sulfur hexafluoride (SF6), octafluorocyclobutane (C4F8) and nitrogen trifluoride (NF3).

In an exemplary embodiment, the fluorine deposition layer is disposed on a surface of the active pattern contacting with the etch stopper.

According to still another exemplary embodiment of the invention, a method of manufacturing a TFT substrate includes disposing a first insulation layer on a base substrate, disposing an active pattern on the first insulation layer, the active pattern including an oxide semiconductor and including a channel portion, a source portion and a drain portion, the source portion and the drain portion connected to the channel portion, disposing a preliminary second insulation layer on the active pattern, disposing a gate electrode partially overlapped with the active pattern on the preliminary second insulation layer, providing a second insulation layer to expose the source portion and the drain portion of the active pattern by patterning the preliminary second insulation layer, disposing a fluorine deposition layer on an exposed active pattern and providing a passivation layer to cover the gate electrode and the exposed active pattern.

In an exemplary embodiment, the disposing the fluorine deposition layer may include treating the source portion and the drain portion by plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3).

In an exemplary embodiment, the providing the passivation layer may include reducing a part of the active pattern to provide a source electrode and a drain electrode including a metal.

In an exemplary embodiment, the passivation layer may include silicon nitride fluoride (SiNF).

According to still another exemplary embodiment of the invention, a method of manufacturing a TFT substrate includes disposing a gate electrode on a base substrate, disposing a first insulation layer on the gate electrode, providing an active pattern on the first insulation layer, the active pattern including an oxide semiconductor, disposing a fluorine deposition layer on the active pattern, disposing an etch stopper on the active pattern and disposing a source electrode and a drain electrode on the etch stopper.

In an exemplary embodiment, the disposing the fluorine deposition layer may include treating the active pattern by plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3).

In an exemplary embodiment, the etch stopper may include silicon oxide fluoride (SiOF) or silicon nitride fluoride (SiNF).

According to one or more exemplary embodiment, an active pattern of a switching element includes a channel, a source electrode and a drain electrode. The fluorine deposition layer on the source electrode and a drain electrode so that a diffusion of hydrogen included in the passivation layer into the source electrode and the drain electrode may be effectively prevented.

In addition, the passivation layer includes silicon nitride fluoride (SiNF). The silicon nitride fluoride (SiNF) includes relatively little hydrogen so that relatively little hydrogen may be diffused into the source electrode and the drain electrode. Thus, a length of an effective channel length may not be decreased.

In addition, in a structure of a TFT including an etch stopper, the fluorine deposition layer may be disposed on the exposed active pattern. The fluorine deposition layer may effectively prevent from diffusion of hydrogen into the active pattern. The etch stopper includes silicon oxide fluoride (SiOF) or silicon nitride fluoride (SiNF). The silicon oxide fluoride (SiOF) and silicon nitride fluoride (SiNF) include relatively little hydrogen so that relatively little hydrogen may be diffused into the active pattern. Thus, a quality of a display apparatus may be improved.

BRIEF DESCRIPTION OF THE DRAWINGS

The above and other aspects, advantages and features of this disclosure will become more apparent by describing in further detail exemplary embodiments thereof in conjunction with the accompanying drawings, in which.

DETAILED DESCRIPTION

Figure 1:
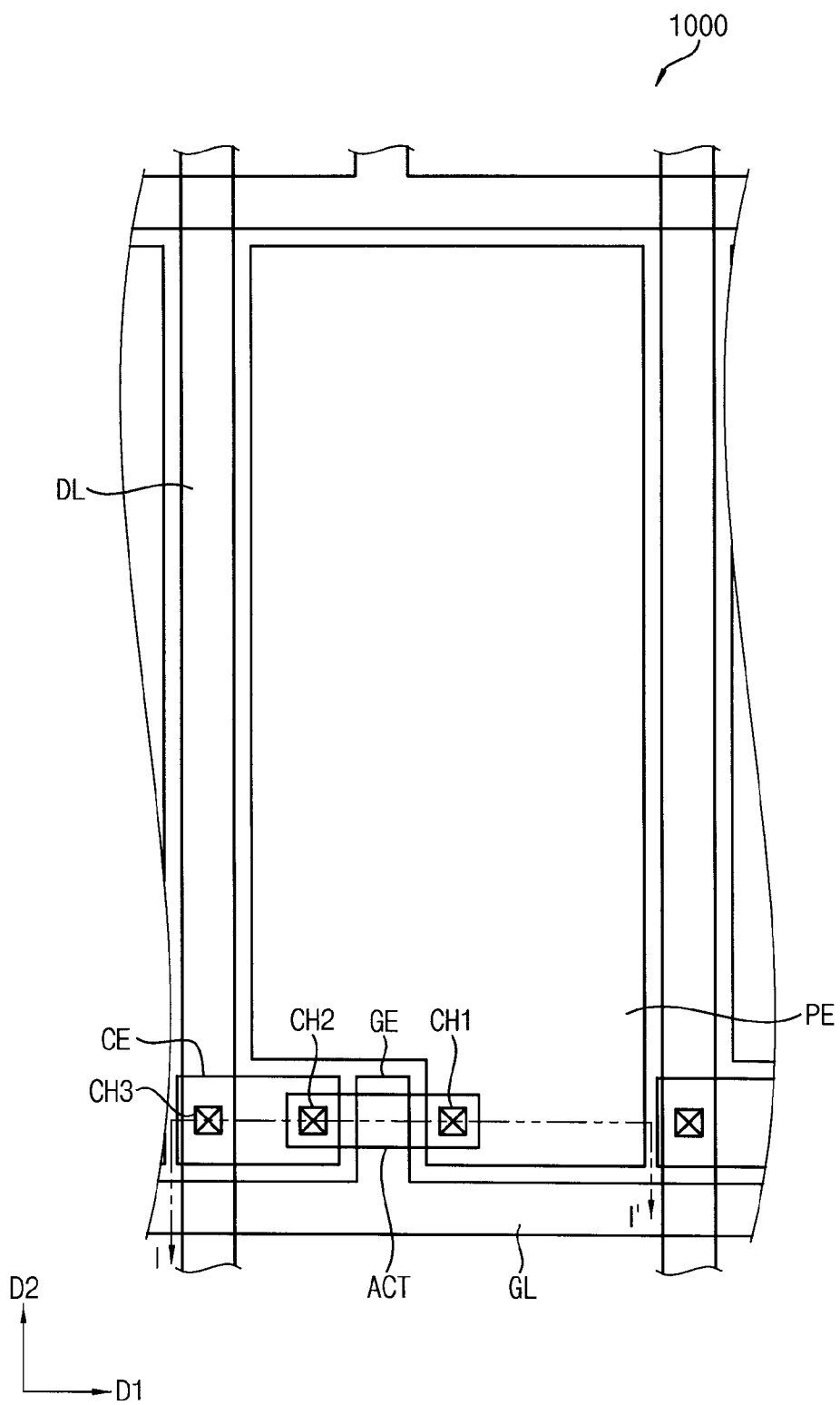
FIG. 1 is a plan view illustrating an exemplary embodiment of a thin film transistor ("TFT") substrate according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be explained in detail with reference to the accompanying drawings.

FIG. 1 is a plan view illustrating an exemplary embodiment of a thin film transistor ("TFT") substrate according to the invention.

Referring to FIG. 1, the display substrate 1000 includes a gate line GL, a data line DL, a pixel electrode PE, a connecting electrode CE and a switching element including an active pattern ACT.

The gate line GL extends in a first direction D1. The data line DL extends in a second direction D2 substantially perpendicular to the first direction D1, and crosses the gate line GL.

In an exemplary embodiment, the gate line GL and the data line DL may define a pixel area. However, the invention is not limited thereto, and the pixel area may not be defined by the gate line GL and the data line DL. Although only one pixel area is described in the figures, the display substrate according to exemplary embodiments generally includes a large number of pixel units respectively disposed in respective pixel areas. The pixel areas are typically arrayed, for example, as a regular matrix structure having a plurality of rows and columns. The pixel areas typically have same basic and repeated structures (although some variations for example in color of color filter portion or size or shape of pixel-electrode may occur) so that only one pixel area will be described herein as an example. Although the pixel area has a rectangular shape in the figures in the illustrated exemplary embodiment, the invention is not limited thereto, and the pixel area may have various modifications in size and/or shape and/or number of field altering slits or other fine features included therein. In an exemplary embodiment, the pixel areas may have V or Z shapes, for example.

The switching element includes a gate electrode GE and an active layer element including the active pattern ACT, a source electrode S and a drain electrode D. The gate electrode GE of the switching element protrudes from the gate line GL in the second direction D2. The gate electrode GE overlaps with the active pattern ACT.

The pixel electrode PE is disposed in the pixel area. The pixel electrode PE is electrically connected to the drain electrode through a first contact hole CH1.

The source electrode is electrically connected to the connecting electrode CE through a second contact hole CH2. The connecting electrode CE is electrically connected to the data line DL through a third contact hole CH3.

Figure 2:
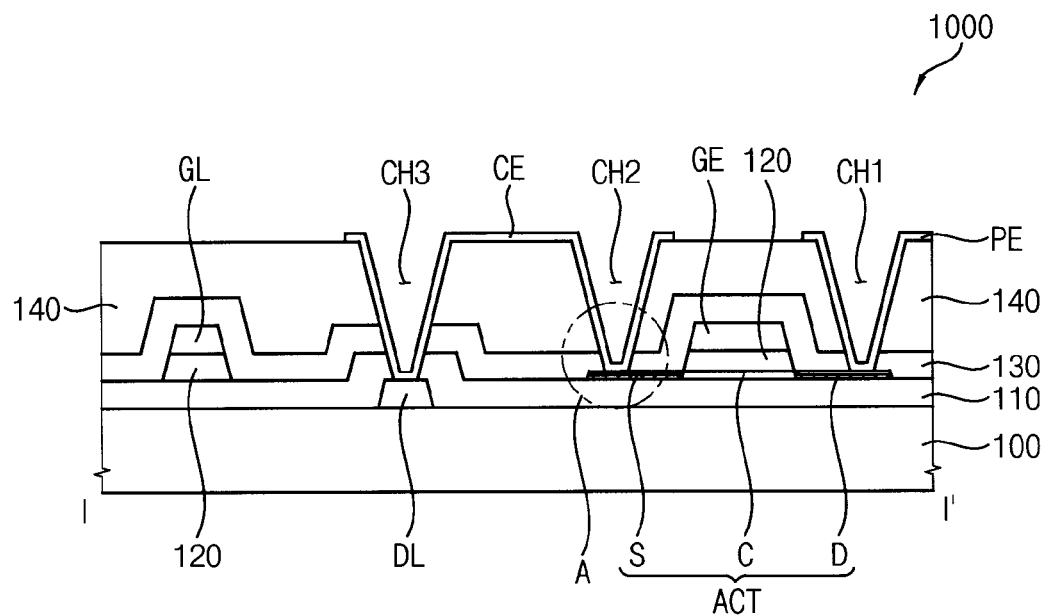
FIG. 2 is a cross-sectional view taken along line I-I' of FIG. 1.
Figure 3:
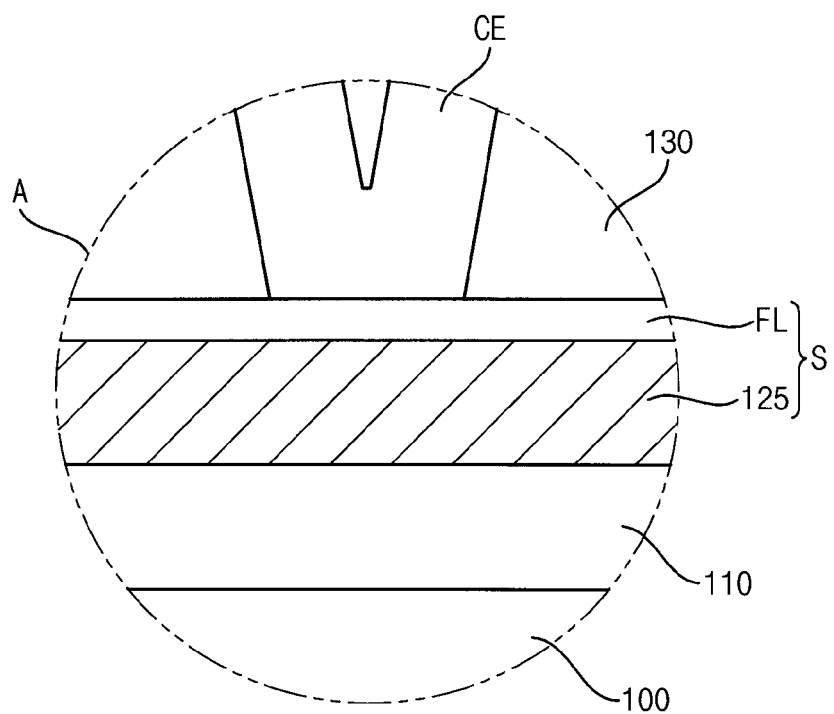
FIG. 3 is an enlarged cross-sectional view of portion A of FIG. 2.

FIG. 2 is a cross-sectional view taken along line I-I' in FIG. 1. FIG. 3 is an enlarged cross-sectional view illustrating portion A of FIG. 2.

Referring to FIGS. 2 and 3, the display substrate 1000 includes a base substrate 100, a data line DL, a first insulation layer 110, an active pattern ACT, a second insulation layer 120, a gate electrode GE, a gate line GL, a passivation layer 130, a planarizing layer 140, a connecting electrode CE and a pixel electrode PE.

In an exemplary embodiment, the base substrate 100 may include a glass substrate, a quartz substrate, a silicon substrate, a plastic substrate or the like.

The data line DL is disposed on the base substrate 100. The data line DL may have a single-layered structure including copper (Cu), silver (Ag), chrome (Cr), molybdenum (Mo), aluminum (Al), titanium (Ti), manganese (Mn) or any combinations thereof. Alternatively, the data line DL may have a multi-layered structure including a plurality of layers having materials different from each other. In an exemplary embodiment, the data line DL may include a copper layer and a titanium layer disposed on and/or under the copper layer, for example.

The first insulation layer 110 covers the base substrate 100 and the data line DL. The first insulation layer 110 electrically insulates the data line DL. The first insulation layer 110 may include inorganic material such as silicon oxide (SiOx) and/or silicon nitride (SiNx). In an exemplary embodiment, the first insulation layer 110 includes silicon oxide (SiOx), and may have thickness about 500 angstrom (Å), for example. In addition, the first insulation layer 110 may include a plurality of layers including materials different from each other.

The active pattern ACT includes a channel C, a source electrode S connected to the channel C, and a drain electrode D connected to the channel C. The source electrode S and the drain electrode D are provided in and/or on a same layer. The channel C is disposed between the source electrode S and the drain electrode D.

A length of the source electrode S, i.e., a distance between an end of the source electrode S and a portion of the source electrode S connected to the channel C, may be less than 200 micrometers (μm). In an exemplary embodiment, the length may be about 100 μm to about 200 μm, for example. In addition, a length of the drain electrode D, i.e., a distance between an end of the drain electrode D and a portion of the drain electrode D connected to the channel C, may be less than 200 μm. In an exemplary embodiment, the length may be about 100 μm to about 200 μm, for example.

The source electrode S and the drain electrode D may include a fluorine deposition layer FL and an electrode layer 125. Plasma is applied to an exposed portion of the active pattern ACT to provide the fluorine deposition layer FL. The plasma may include a gas including fluorine, for example. The plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3). The fluorine deposition layer FL may effectively prevent hydrogen included in the passivation layer 130 from diffusing into the source electrode S and the drain electrode D.

The second insulation layer 120 is disposed on the active pattern ACT and the first insulation layer 110. Thus, the second insulation layer 120 is patterned such that the second insulation layer 120 remains only under the gate line GL and the gate electrode GE.

The second insulation layer 120 may include inorganic material. In an exemplary embodiment, the second insulation layer 120 may include silicon oxide (SiOx), and have a thickness of about 1000 Å, for example. The second insulation layer 120 may have a thickness of about 500 Å to about 1000 Å. In addition, the second insulation layer 120 may include a plurality of layers including materials different from each other.

The gate electrode GE is disposed on the second insulation layer 120. The gate electrode GE overlaps with the channel C of the active pattern ACT. The gate electrode GE does not overlap with the source electrode S and the drain electrode D. The gate electrode GE is electrically connected to the gate line GL. The gate electrode GE may include the same material as that of the gate line GL.

The channel C, the source electrode S, the drain electrode D and the gate electrode GE constitute a switching element. A gate signal is applied to the gate electrode GE through the gate line GL so that the channel C of the active pattern ACT has conductivity. Accordingly, a data signal from the data line DL is applied to the pixel electrode PE through the connecting electrode CE, the source electrode S, the channel C and the drain electrode D.

The gate line GL is disposed on the second insulation layer 120. The gate line GL may have a single-layered structure including copper (Cu), silver (Ag), chrome (Cr), molybdenum (Mo), aluminum (Al), titanium (Ti), manganese (Mn) or any combinations thereof. In addition, the gate line GL may have a multi-layered structure including a plurality of layers including materials different from each other. In an exemplary embodiment, the gate line GL may include a copper layer and a titanium layer disposed on and/or under the copper layer, for example.

The passivation layer 130 covers the gate electrode GE and the gate line GL. The passivation layer 130 may include silicon nitride fluoride (SiNF). In an exemplary embodiment, the passivation layer 130 includes silicon nitride fluoride (SiNF), and has a thickness of about 1000 Å, for example.

The planarizing layer 140 is disposed on the passivation layer 130. The planarizing layer 140 planarizes an upper surface of the substrate 1000 so that problems due to the step such as disconnection of a signal line may be effectively prevented. The first planarizing layer 140 may be an insulation layer including an organic material.

A first contact hole CH1 is defined through the planarizing layer 140 and the passivation layer 130 so that the first contact hole CH1 exposes a portion of the drain electrode D. A second contact hole CH2 is defined through the planarizing layer 140 and the passivation layer 130 so that the second contact hole CH2 exposes a portion of the source electrode S. A third contact hole CH3 is defined through the planarizing layer 140, the passivation layer 130 and the first insulation layer 110 so that the third contact hole CH3 exposes a portion of the data line DL.

The pixel electrode PE is disposed on the planarizing layer 140, and electrically connected to the drain electrode D through the first contact hole CH1. The pixel electrode may include a transparent conductive material such as indium tin oxide ("ITO"), indium zinc oxide ("IZO") and etc. In addition, the pixel electrode PE may include titanium (Ti) and/or molybdenum titanium (MoTi).

The connecting electrode CE is disposed on the planarizing layer 140. The connecting electrode CE connects the data line DL to the source electrode S through the second contact hole CH2 and the third contact hole CH3. Thus, the data line DL is electrically connected to the source electrode S. The connecting electrode CE may include the same material as that of the pixel electrode PE. In an exemplary embodiment, the connecting electrode CE may include indium tin oxide ("ITO") indium zinc oxide ("IZO") and etc. In addition, the connecting electrode CE may include titanium (Ti) and/or molybdenum titanium (MoTi).

FIGS. 4A to 4I are cross-sectional views illustrating an exemplary embodiment of a method of manufacturing the TFT substrate of FIGS. 1 and 2.

Figure 4A:
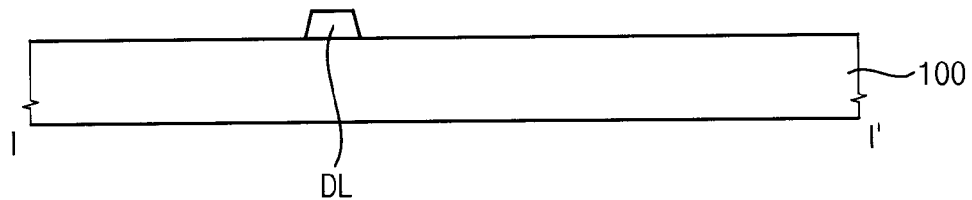
FIGS. 4A to 4I are cross-sectional views illustrating an exemplary embodiment of a method of manufacturing the TFT substrate of FIGS. 1 and 2.

Referring to FIG. 4A, a data metal layer is disposed on a base substrate 100. The base substrate 100 may include a glass substrate, a quartz substrate, a silicon substrate, a plastic substrate, etc. The data metal layer may be provided by a sputtering process.

The data metal layer may have a single-layered structure including copper (Cu), silver (Ag), chrome (Cr), molybdenum (Mo), aluminum (Al), titanium (Ti), manganese (Mn) or any combinations thereof. Alternatively, the data metal layer may have a multi-layered structure including a plurality of layers having materials different from each other.

The data metal layer may be patterned to provide a data line DL. In an exemplary embodiment, a photoresist composition is coated on the data metal layer and then patterned to provide a photoresist pattern having a shape corresponding to the data line DL, for example. Then, the data metal layer, which is not covered by the photoresist pattern, is etched to provide the data line DL.

Figure 4B:
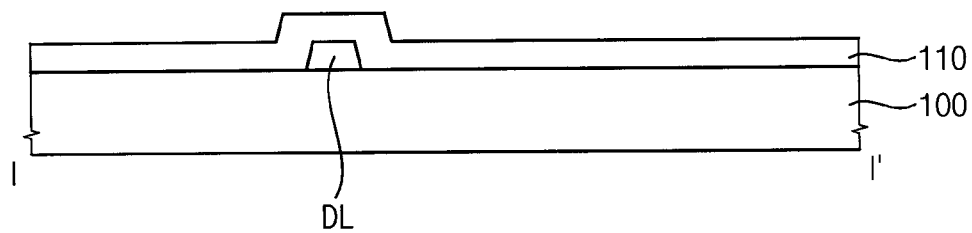

Referring to FIG. 4B, a first insulation layer 110 is provided to cover the base substrate 100 and the data line DL. The first insulation layer 110 may include inorganic material. In an exemplary embodiment, the first insulation layer 110 may include silicon oxide (SiOx), and have a thickness of about 500 Å, for example.

Figure 4C:
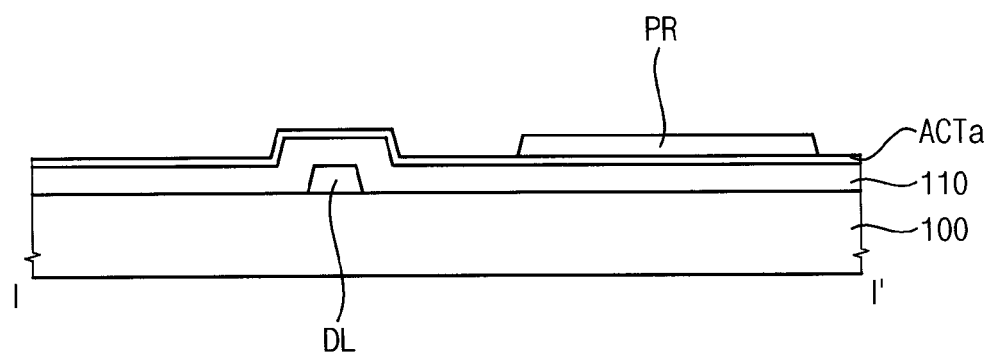

Referring to FIG. 4C, an active layer ACTa is disposed on the first insulation layer 110. The active layer ACTa may include a metal oxide semiconductor. In an exemplary embodiment, the metal oxide semiconductor may include an oxide of zinc, indium, gallium, tin, titanium, phosphor or any combinations thereof, for example. Particularly, the metal oxide semiconductor may include at least one of zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

The active layer ACTa may be provided by a chemical vapor deposition ("CVD") process, a plasma enhanced chemical vapor deposition ("PECVD") process, a solution coating process, or the like.

A photoresist pattern PR corresponding to an active pattern (see ACT of FIG. 4D) is disposed on the active layer ACTa.

Figure 4D:
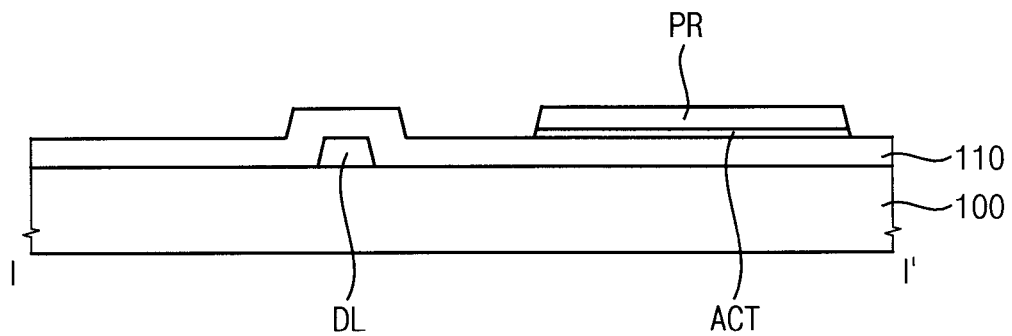

Referring to FIG. 4D, the active layer ACTa is patterned to provide the active pattern ACT. In an exemplary embodiment, an exposed portion of the active pattern ACT is etched by using the photoresist pattern PR as a mask, for example. Accordingly, an upper surface of the first insulation layer 110 is partially exposed. Then, the photoresist pattern PR is removed from the base substrate 100.

Figure 4E:
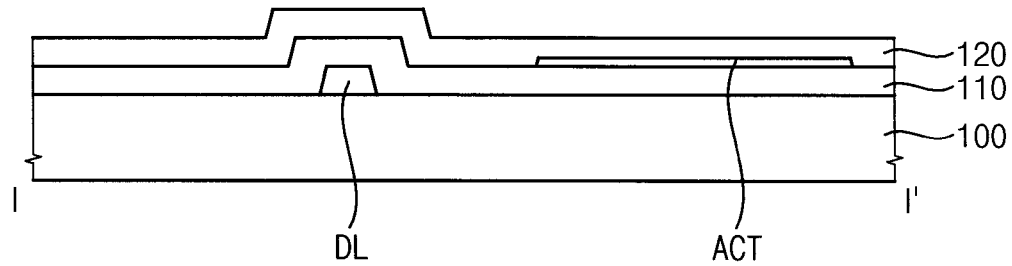

Referring to FIG. 4E, a second insulation layer 120 is disposed on the first insulation layer 110 and the active pattern ACT. The second insulation layer 120 may include inorganic material. In an exemplary embodiment, the second insulation layer 120 may include silicon oxide (SiOx), and have a thickness less than about 1000 Å, for example. The second insulation layer 120 may have a thickness of about 500 Å to about 1000 Å. In addition, the second insulation layer 120 may have a multi-layered structure including a plurality of layers having materials different from each other.

Figure 4F:
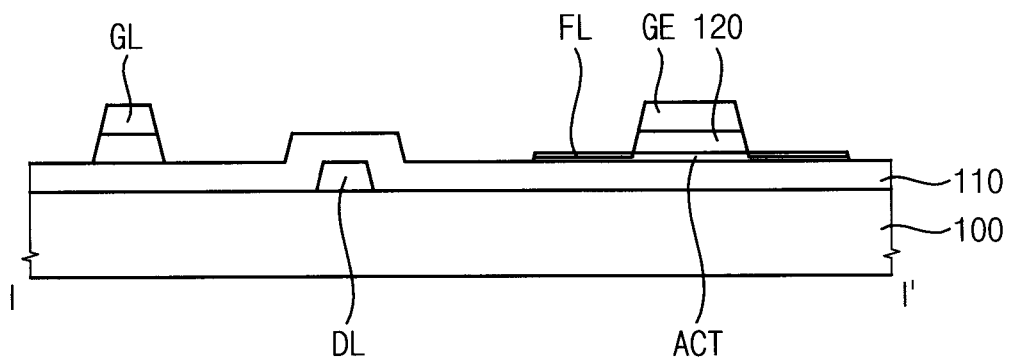

Referring to FIG. 4F, a gate metal layer is disposed on the second insulation layer 120. The gate metal layer may have a single-layered structure including copper (Cu), silver (Ag), chrome (Cr), molybdenum (Mo), aluminum (Al), titanium (Ti), manganese (Mn) or any combinations thereof. Alternatively, the gate metal layer may have a multi-layered structure including a plurality of layers having materials different from each other.

The gate metal layer is patterned to provide a gate line GL and a gate electrode GE. In an exemplary embodiment, a photoresist composition is coated on the gate metal layer and patterned to provide a photoresist pattern having a shape corresponding to the gate line GL and the gate electrode GE, for example. Then, the gate metal layer, which is not covered by the photoresist pattern, is etched to provide the gate line GL and the gate electrode GE.

After the gate line GL and the gate electrode GE are provided, the second insulation layer 120 is patterned. Accordingly, the second insulation layer 120 may remain only under the gate line GL and the gate electrode GE. Thus, the active pattern ACT may be partially exposed.

After the active pattern ACT is partially exposed, the exposed active pattern ACT may be treated by plasma. The plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3), may be supplied to the exposed active pattern ACT. Thus, the fluorine deposition layer FL may be disposed on the exposed active pattern ACT. The fluorine deposition layer FL may effectively prevent hydrogen included in a passivation layer 130 from diffusing into a source electrode S and a drain electrode D.

Figure 4G:
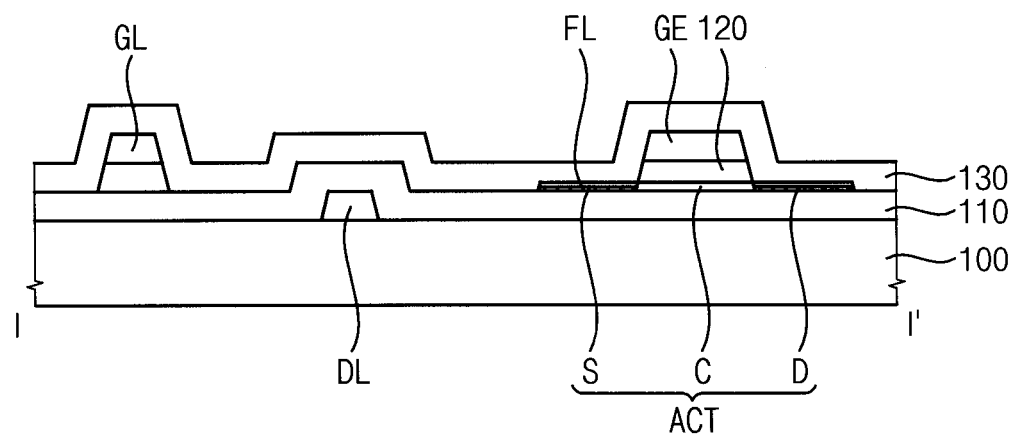

Referring to FIG. 4G, a passivation layer 130 is disposed on the first insulation layer 110, the gate electrode GE, the active pattern ACT and the gate line GL. The passivation layer 130 may include inorganic material. In an exemplary embodiment, the passivation layer 130 may include silicon nitride (SiNx), and have a thickness of about 1000 Å, for example. The passivation layer 130 is provided so that the source electrode S and the drain electrode D of the active pattern ACT may be provided.

The passivation layer 130 may be provided by a deposition process. In an exemplary embodiment, the passivation layer 130 may be provided by the CVD, the PECVD or the like, for example. In an exemplary embodiment, a gas for the deposition process may have more than 10 percent (%) of hydrogen, have a process temperature of more than about 300 degrees Celsius (° C.), and have a deposition rate of more than about 10 Å/sec, for example.

The passivation layer 130 includes silicon nitride fluoride (SiNF). The silicon nitride fluoride (SiNF) includes relatively little hydrogen so that relatively little hydrogen may be diffused into the source electrode S and the drain electrode D. Thus, an effective channel length may be effectively prevented from being decreased.

Figure 4H:
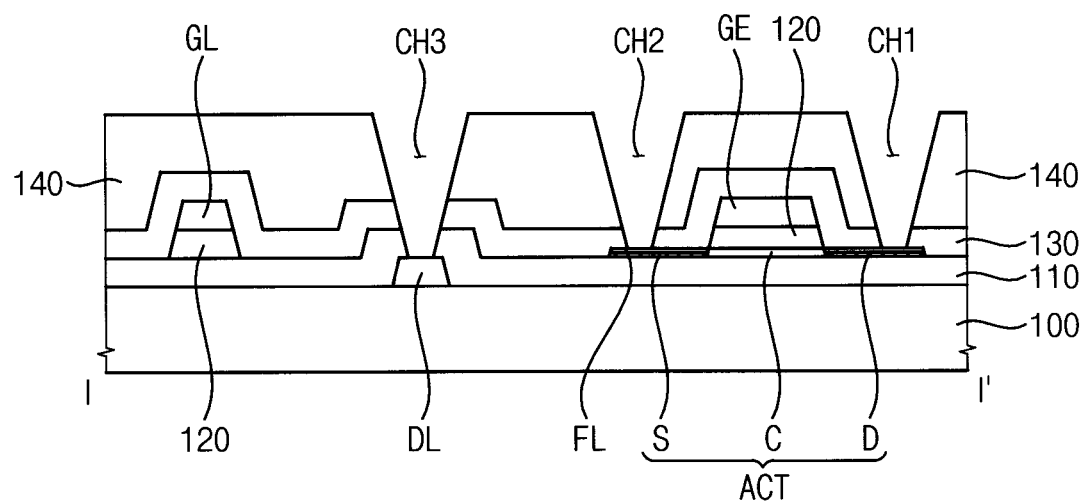

Referring to FIG. 4H, a planarizing layer 140 is disposed on the passivation layer 130. The planarizing layer 140 may include an organic insulation material. A photoresist composition may be coated on the passivation layer 130 through a spin coating to provide the planarizing layer 140. The first contact hole CH1, the second contact hole CH2 and the third contact hole CH3 may be defined by patterning the planarizing layer 140.

The first contact hole CH1 is defined to penetrate through the planarizing layer 140 and the passivation layer 130, and exposes a portion of the drain electrode D. The second contact hole CH2 is defined to penetrate through the planarizing layer 140 and the passivation layer 130, and exposes a portion of the source electrode S. The third contact hole CH3 is defined to penetrate through the planarizing layer 140, the passivation layer 130 and the first insulation layer 110, and exposes a portion of the data line DL.

Figure 4I:
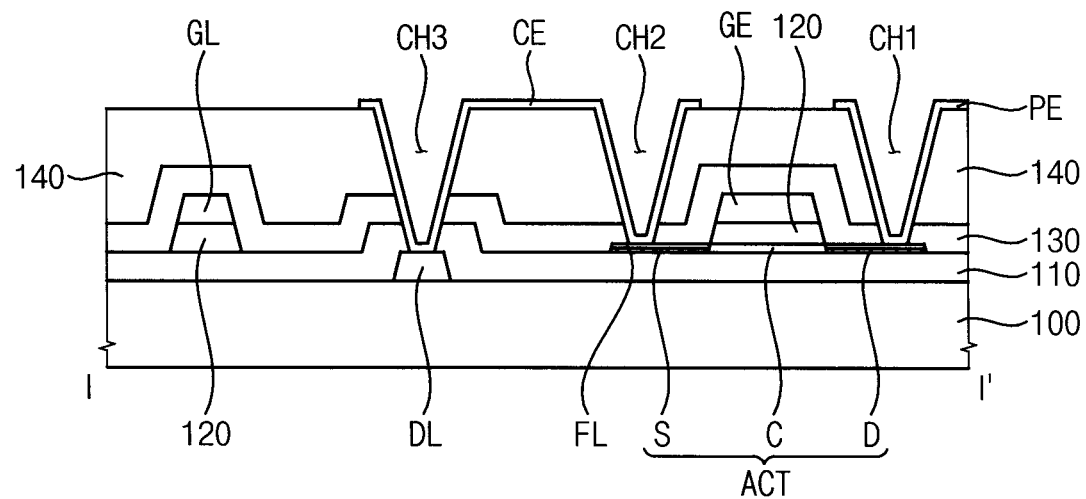

Referring FIG. 4I, a pixel electrode PE and a connecting electrode CE are disposed on the planarizing layer 140. A transparent conductive layer is disposed on the planarizing layer 140. Then, the transparent conductive layer is patterned to provide the pixel electrode PE and the connecting electrode CE. The transparent conductive layer may include a transparent conductive material such as indium tin oxide ("ITO"), indium zinc oxide ("IZO") and etc.

The pixel electrode PE is electrically connected to the drain electrode D through the first contact hole CH1. The connecting electrode CE is electrically connected to the source electrode S through the second contact hole CH2, and is electrically connected to the data line DL through the third contact hole CH3.

According to exemplary embodiments of the invention, an active pattern ACT of a switching element includes a channel C, a source electrode S and a drain electrode D. The fluorine deposition layer FL (FIG. 3) on the source electrode S and a drain electrode D so that a diffusion of hydrogen included in the passivation layer 130 into the source electrode S and the drain electrode D may be effectively prevented.

In addition, the passivation layer 130 includes silicon nitride fluoride (SiNF). The silicon nitride fluoride (SiNF) includes relatively little hydrogen so that relatively little hydrogen may be diffused into the source electrode S and the drain electrode D. Thus, an effective channel length may be effectively prevented from being decreased.

Figure 5:
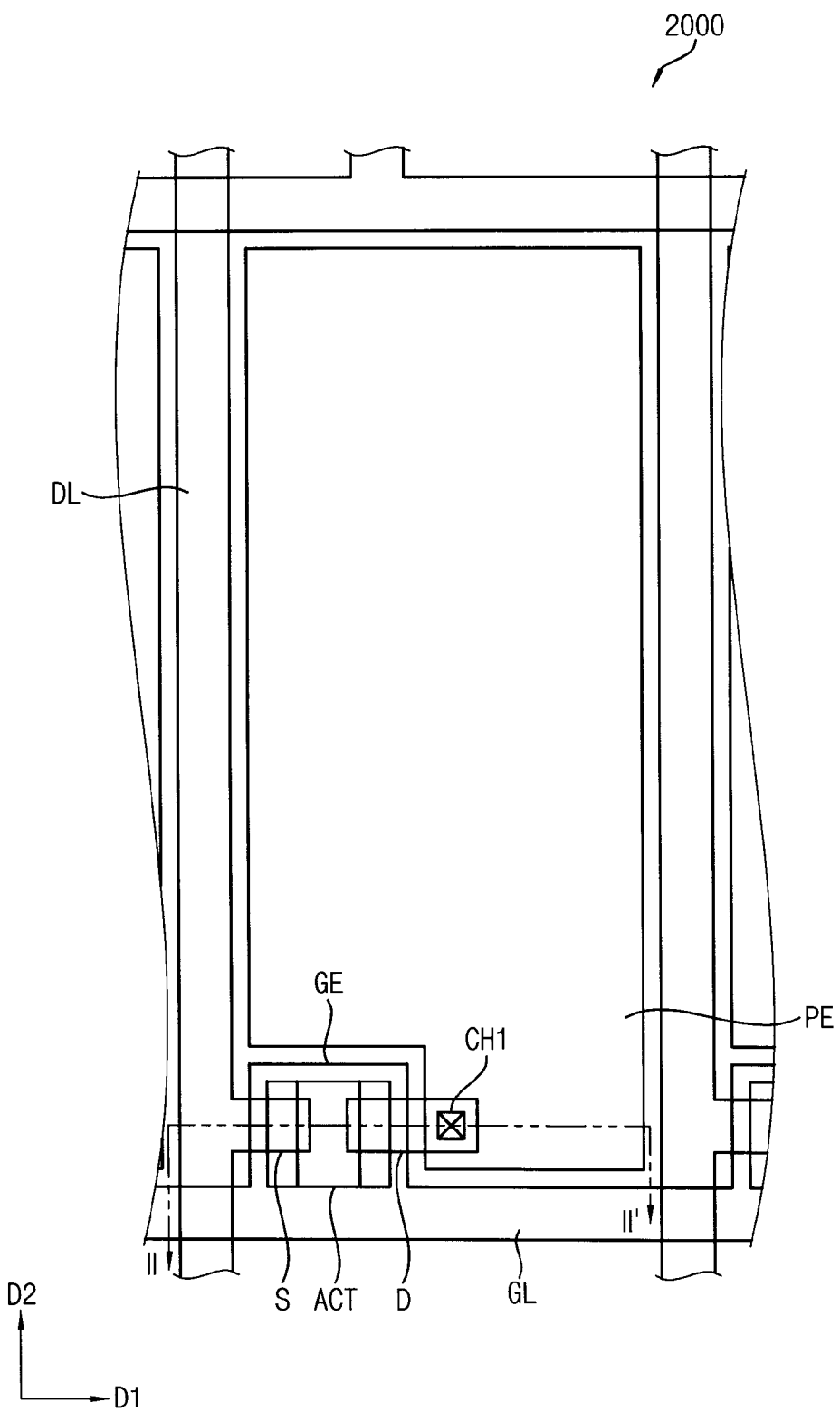
FIG. 5 is a plan view illustrating another exemplary embodiment of TFT substrate according to the invention.
Figure 6:
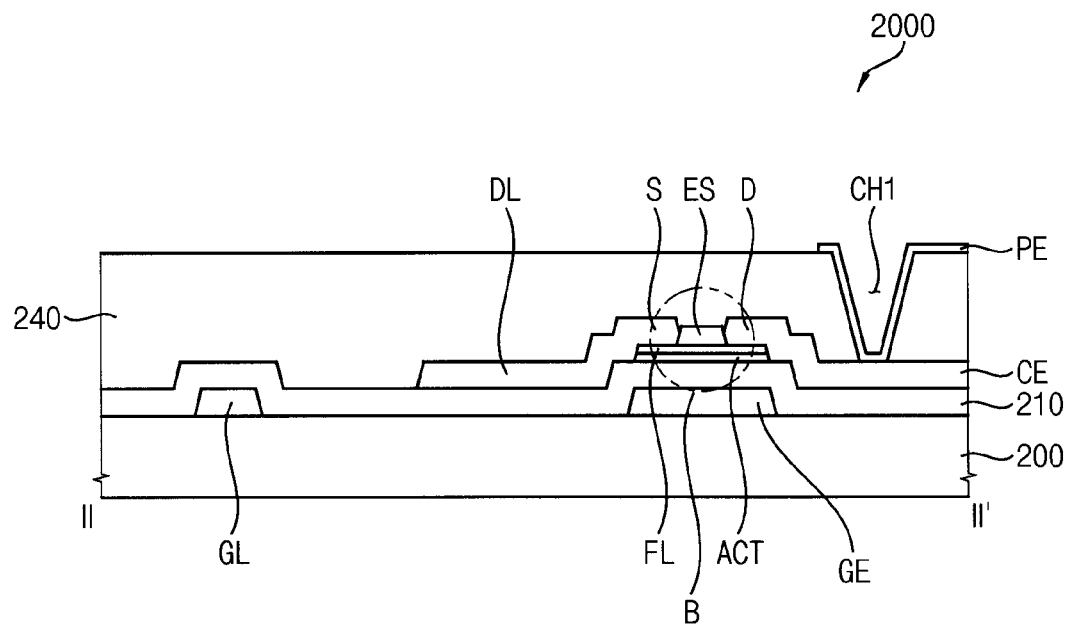
FIG. 6 is a cross-sectional view taken along line II-II' of FIG. 5.
Figure 7:
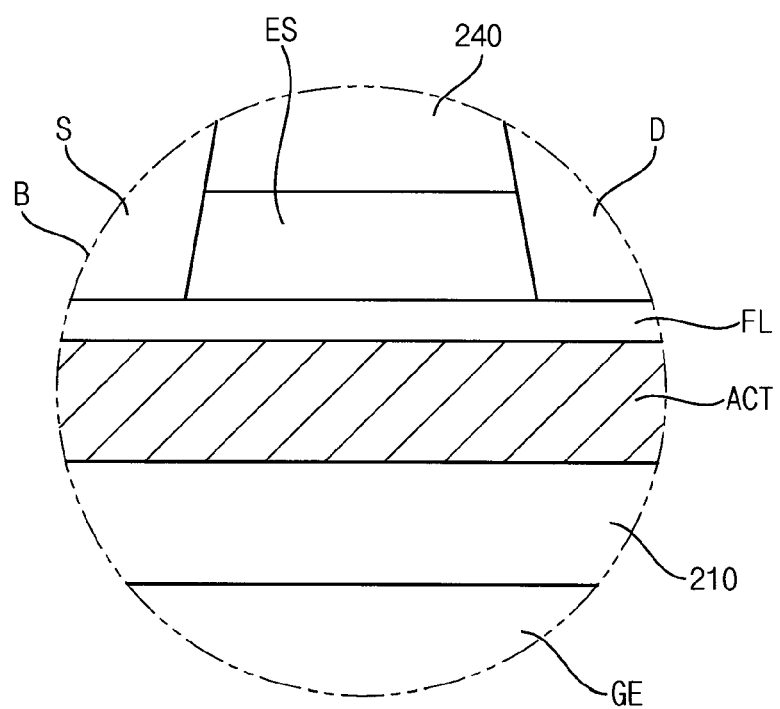
FIG. 7 is an enlarged cross-sectional view of portion B of FIG. 6.

FIG. 5 is a plan view illustrating another exemplary embodiment of a TFT substrate according to the invention. FIG. 6 is a cross-sectional view taken along line II-II' of FIG. 5. FIG. 7 is an enlarged cross-sectional view of portion B of FIG. 6.

Referring to FIG. 5, the display substrate 2000 includes a gate line GL, a data line DL, a pixel electrode PE, a connecting electrode CE and a switching element including an active pattern ACT.

The gate line GL extends along a first direction D1. The data line DL extends along a second direction D2 substantially perpendicular to the first direction D1, and crosses the gate line GL.

In an exemplary embodiment, the gate line GL and the data line DL define a pixel area. However, the invention is not limited thereto, and the pixel area may not be defined by the gate line GL and the data line DL. Although only one pixel area is described in the figures, the display substrate according to the exemplary embodiments generally includes a large number of pixel units respectively disposed in respective pixel areas. In an exemplary embodiment, the pixel areas are typically arrayed as a regular matrix structure having a plurality of rows and columns, for example. Since the pixel areas typically have same basic and repeated structures (although some variations for example in color of color filter portion or size or shape of pixel-electrode may occur), only one pixel area will be described herein as an example. Although the pixel area has a rectangular shape in the figures, the pixel area may have various modifications in size and/or shape and/or number of field altering slits or other fine features included therein. In an exemplary embodiment, the pixel areas may have V or Z shapes, for example.

The switching element includes a gate electrode GE and the active pattern ACT. The gate electrode GE of the switching element is provided by protruding from the gate line GL in a second direction D2. The gate electrode GE overlaps with the active pattern ACT.

The pixel electrode PE is disposed in the pixel area. The pixel electrode PE is electrically connected to the drain electrode through a first contact hole CH1. The source electrode S of the switching element is provided by protruding from the data line DL in a first direction D1.

Referring to FIGS. 6 and 7, the display substrate 2000 includes a base substrate 200, a gate line GL, a gate electrode GE, a first insulation layer 210, an active pattern ACT, a fluorine deposition layer FL, a source electrode S, a drain electrode D, an etch stopper ES, a data line DL, a second insulation layer 240 and a pixel electrode PE.

In an exemplary embodiment, the base substrate 200 may include a glass substrate, a quartz substrate, a silicon substrate, a plastic substrate or the like.

The gate line GL is disposed on the base substrate 200. The data line DL may have a single layer structure including copper (Cu), silver (Ag), chrome (Cr), molybdenum (Mo), aluminum (Al), titanium (Ti), manganese (Mn) or any combinations thereof. In addition, the gate line GL may have a multi-layer structure including a plurality of layers including materials different each other. In an exemplary embodiment, the gate line GL may include a copper layer and a titanium layer disposed on and/or under the copper layer, for example.

The gate electrode GE is disposed on the base substrate 200. The gate electrode GE is electrically connected with the gate line GL. The gate electrode GE may include the same material as that of the gate line GL.

The first insulation layer 210 may cover the base substrate 200 and the data line DL. The first insulation layer 210 may include inorganic material such as silicon oxide (SiOx) and/or silicon nitride (SiNx). In an exemplary embodiment, the first insulation layer 210 includes silicon oxide (SiOx), and may have thickness about 500 Å, for example. In addition, the first insulation layer 210 may include a plurality of layers including materials different each other.

The active pattern ACT may be disposed on the first insulation layer 210. The active pattern ACT may include a metal oxide semiconductor. In an exemplary embodiment, the metal oxide semiconductor may include an oxide of zinc, indium, gallium, tin, titanium, phosphor or any combinations thereof, for example. Particularly, the metal oxide semiconductor may include at least one of zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

The fluorine deposition layer FL may be provided from the active pattern ACT. The active pattern ACT may be treated by plasma so that the fluorine deposition layer FL may be provided. The plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3), may be supplied to an exposed active pattern ACT. Thus, the fluorine deposition layer FL may be disposed on the exposed active pattern ACT. The fluorine deposition layer FL may effectively prevent from diffusion of hydrogen into the active pattern ACT. The active pattern ACT may be overlapped with the gate electrode GE.

The etch stopper ES may be disposed on the active pattern ACT. The etch stopper ES may be disposed between the source electrode S and the drain electrode D. The etch stopper ES may include inorganic material. In an exemplary embodiment, the etch stopper ES may include silicon oxide fluoride (SiOF) or silicon nitride fluoride (SiNF), for example.

The data line DL may be disposed on the first insulation layer 210. The data line DL is extended to connect with the source electrode S. The data line DL may have a single layer structure including copper (Cu), silver (Ag), chrome (Cr), molybdenum (Mo), aluminum (Al), titanium (Ti), manganese (Mn) or any combinations thereof. In addition, the data line DL may have a multi-layer structure including a plurality of layers including materials different each other. In an exemplary embodiment, the data line DL may include a copper layer and a titanium layer disposed on and/or under the copper layer, for example.

The second insulation layer 240 is disposed on the first insulation layer 210, the drain electrode D, the source electrode S and the etch stopper ES. The second insulation layer 240 planarizes an upper surface of the substrate 2000 so that problems due to the step such as disconnection of a signal line may be effectively prevented. The second insulation layer 240 may have a multi-layer structure. The second insulation layer 240 may be an insulation layer including an organic material.

The first contact hole CH1 is defined through the second insulation layer 240, and exposes a portion of the drain electrode D.

The pixel electrode PE may be disposed on the second insulation layer 240. The pixel electrode PE is electrically connected to the drain electrode D through the first contact hole CH1. The pixel electrode may include a transparent conductive material such as indium tin oxide ("ITO"), indium zinc oxide ("IZO") and etc. In addition, the pixel electrode PE may include titanium (Ti) and/or molybdenum titanium (MoTi).

FIGS. 8A to 8H are cross-sectional views illustrating an exemplary embodiment of a method of manufacturing the TFT substrate of FIGS. 5 and 6.

Figure 8A:
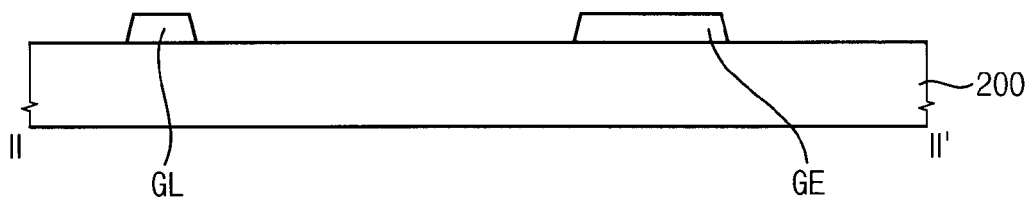
FIGS. 8A to 8H are cross-sectional views illustrating an exemplary embodiment of a method of manufacturing the TFT substrate of FIGS. 5 and 6.

Referring to FIG. 8A, a gate metal layer is disposed on a base substrate 200. Examples of the base substrate 200 may include a glass substrate, a quartz substrate, a silicon substrate, a plastic substrate or the like. The data metal layer may be provided by a sputtering process.

The gate metal layer may have a single layer structure including copper (Cu), silver (Ag), chrome (Cr), molybdenum (Mo), aluminum (Al), titanium (Ti), manganese (Mn) or any combinations thereof. In addition, the gate metal layer may have a multi-layer structure including a plurality of layers including materials different each other.

A gate line GL is provided by patterning the gate metal layer. In an exemplary embodiment, a photoresist composition is coated on the data metal layer to provide a photoresist pattern having a shape corresponding to the gate line GL, for example. Thereafter, the gate metal layer, which is not covered by the photoresist pattern, is etched to provide the gate line GL.

Figure 8B:
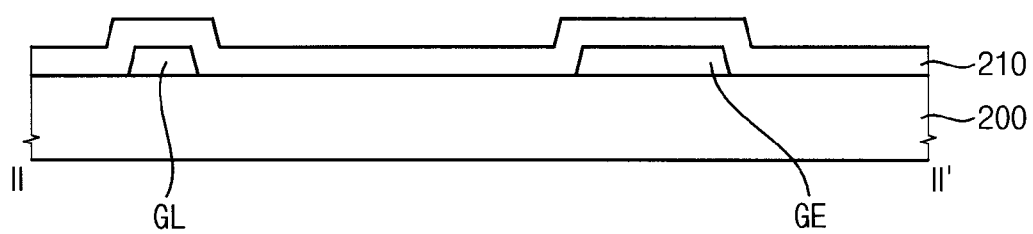

Referring to FIG. 8B, a first insulation layer 210 covering the base substrate 200 and the gate line GL is provided. The first insulation layer 210 may include inorganic material. The first insulation layer 210 may include silicon oxide (SiOx), and have thickness of about 2000 Å, for example.

Figure 8C:
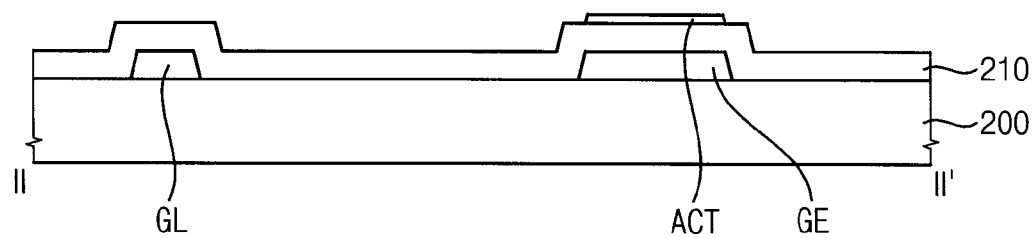

Referring to FIG. 8C, an active layer ACTa (FIG. 4C) is disposed on the first insulation layer 210. The active pattern ACT may be provided by patterning the active layer ACTa. The active layer ACTa may include a metal oxide semiconductor. The metal oxide semiconductor may include an oxide of zinc, indium, gallium, tin, titanium, phosphor or any combinations thereof, for example. Particularly, the metal oxide semiconductor may include at least one of zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

The active layer ACTa (FIG. 4D) may be provided through the CVD process, the PECVD process, a solution coating process, or the like. A photoresist pattern PR corresponding to an active pattern (refers to ACT of FIG. 4D) is disposed on the active layer ACTa. An exposed portion of the active pattern ACTa is etched by using the photoresist pattern PR as a mask, for example. Accordingly, an upper surface of the first insulation layer 210 is partially exposed. Thereafter, the photoresist pattern PR is removed.

Figure 8D:
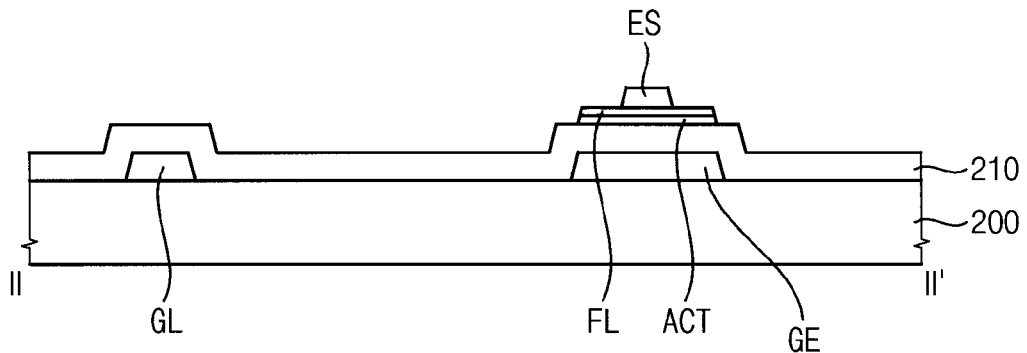

Referring to FIG. 8D, the etch stopper ES is disposed on the active pattern ACT. In an exemplary embodiment, the etch stopper ES may be provided by patterning an insulation layer provided on the active pattern ACT. The etch stopper ES may expose a portion of the active pattern ACT. Before the etch stopper ES is provided, the active pattern ACT is treated by plasma. Thus, the fluorine deposition layer FL may be disposed on the active pattern ACT. The plasma using a gas including at least one selected from silicon tetrafluoride (SiF4), tetrafluoromethane (CF4), sulfur hexafluoride (SF6), octafluorocyclobutane (C4F8) and nitrogen trifluoride (NF3), is supplied to the active pattern ACT. Thus, the fluorine deposition layer FL may be disposed on the exposed active pattern ACT. The fluorine deposition layer FL may effectively prevent from diffusion of hydrogen into the active pattern ACT.

After the fluorine deposition layer FL is provided, the etch stopper ES may be disposed on the active pattern ACT. The etch stopper ES may include silicon oxide fluoride (SiOF) or silicon nitride fluoride (SiNF). The silicon oxide fluoride (SiOF) and silicon nitride fluoride (SiNF) may include relatively little hydrogen.

Figure 8E:
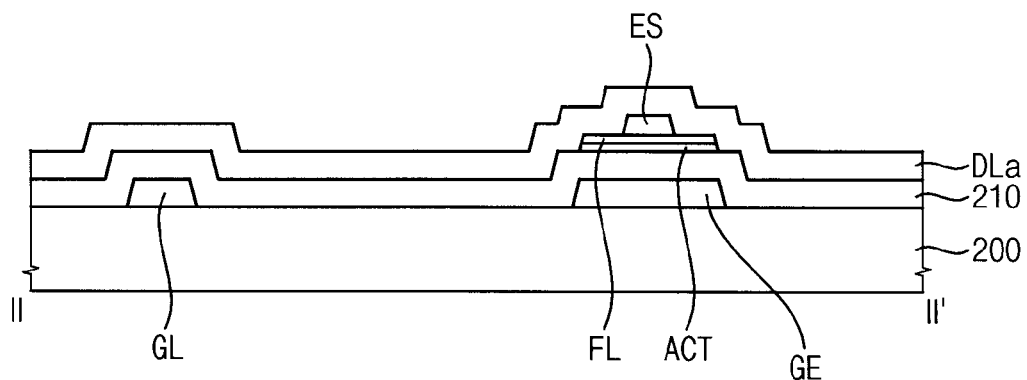

Referring to FIG. 8E, a data metal layer DLa is disposed on the first insulation layer 210, the active pattern ACT and the etch stopper ES. In an exemplary embodiment, the data metal layer DLa may have a single layer structure including copper (Cu), silver (Ag), chrome (Cr), molybdenum (Mo), aluminum (Al), titanium (Ti), manganese (Mn) or any combinations thereof. In another exemplary embodiment, the data metal layer DLa may have a multi-layer structure including a plurality of layers including materials different each other.

Figure 8F:
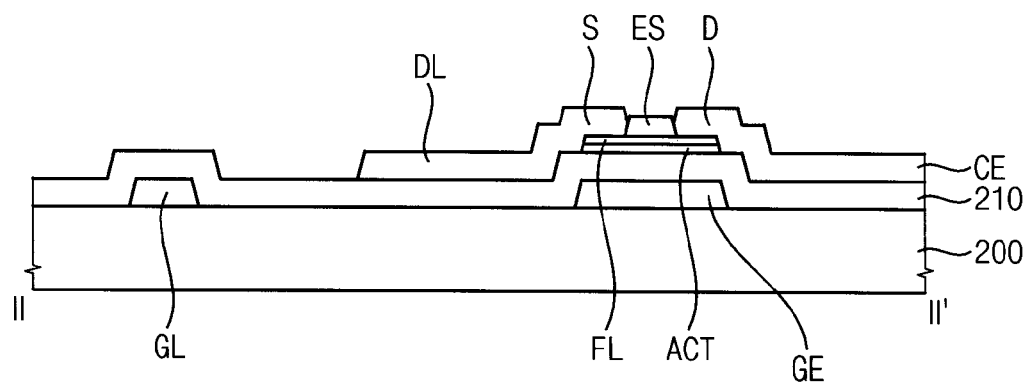

Referring to FIG. 8F, a data line DL, a source electrode S connected with the data line DL and a drain electrode D spaced apart from the source electrode S are provided by patterning the data metal layer DLa. A photoresist composition is coated on the data metal layer DLa to provide a photoresist pattern having a shape corresponding to the data line DL, the source electrode S and the drain electrode D, for example. Thereafter, the data metal layer DLa, which is not covered by the photoresist pattern, is etched to provide the data line DL, the source electrode S and the drain electrode D. At this time, the etch stopper ES effectively prevents the active pattern ACT from being damaged. A connecting electrode CE is provided from the data metal layer DLa.

Figure 8G:
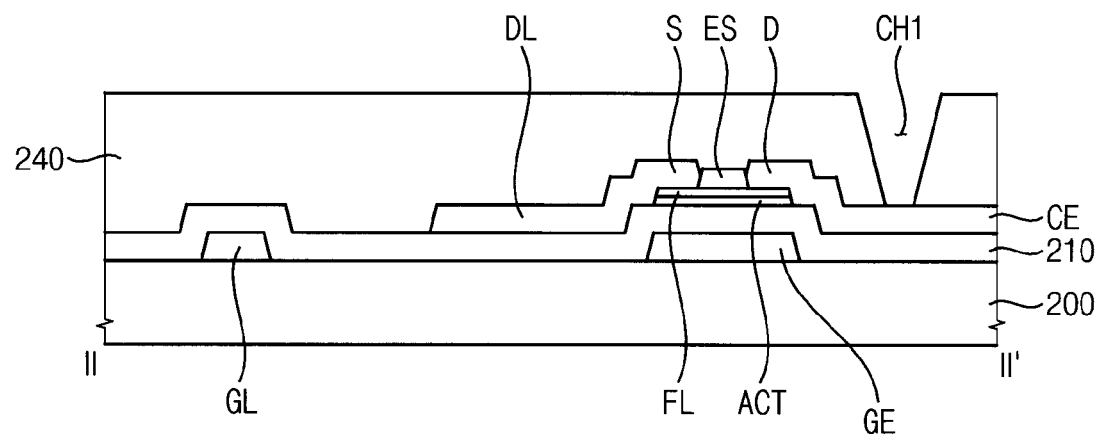

Referring to FIG. 8G, a second insulation layer 240 is disposed on the first insulation layer 210, the drain electrode D and the etch stopper ES. The second insulation layer 240 may include a plurality layers. The second insulation layer 240 may include an inorganic insulation layer and an organic insulation layer disposed on the inorganic insulation layer, for example.

The first contact hole CH1 is defined through the second insulation layer 240 to expose a portion of the drain electrode D.

Figure 8H:
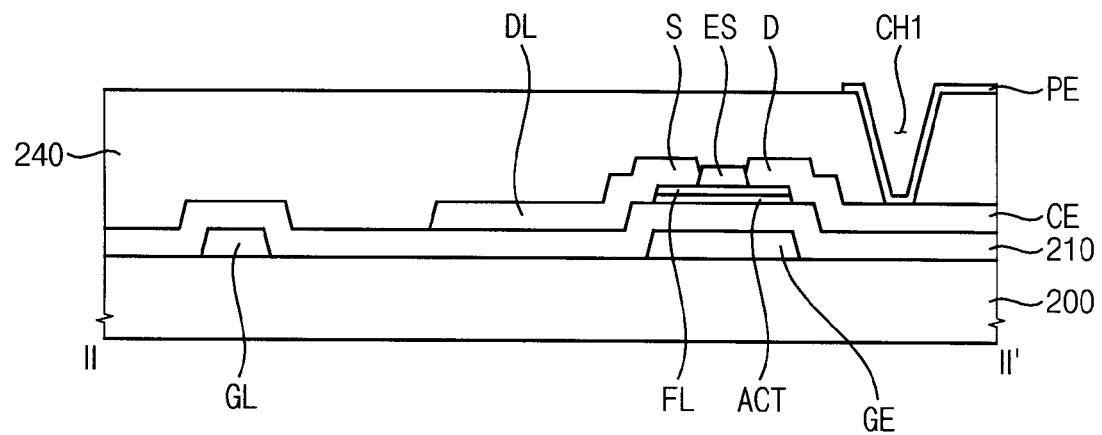

Referring to FIG. 8H, a pixel electrode PE is disposed on the second insulation layer 240. A transparent conductive layer is disposed on the second insulation layer 240. Thereafter, the pixel electrode PE is provided by patterning the transparent conductive layer. The transparent conductive layer may include a transparent conductive material such as indium tin oxide ("ITO"), indium zinc oxide ("IZO") and etc.

According to one or more exemplary embodiment, an active pattern of a switching element includes a channel C, a source electrode S and a drain electrode D. The fluorine deposition layer FL on the source electrode S and a drain electrode D so that a diffusion of hydrogen included in the passivation layer 130 into the source electrode S and the drain electrode D may be effectively prevented.

In addition, the passivation layer includes silicon nitride fluoride (SiNF). The silicon nitride fluoride (SiNF) includes relatively little hydrogen so that relatively little hydrogen may be diffused into the source electrode and the drain electrode. Thus, a length of an effective channel length may not be decreased.

In addition, in a structure of a TFT including an etch stopper, the fluorine deposition layer may be disposed on the exposed active pattern. The fluorine deposition layer may effectively prevent from diffusion of hydrogen into the active pattern. The etch stopper includes silicon oxide fluoride (SiOF) or silicon nitride fluoride (SiNF). The silicon oxide fluoride (SiOF) and silicon nitride fluoride (SiNF) include relatively little hydrogen so that relatively little hydrogen may be diffused into the active pattern. Thus, a quality of a display apparatus may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifies to the disclosed exemplary embodiments, as well as other exemplary embodiments, are intended to be included within the scope of the appended claims. The invention is defined by the following claims, with equivalents of the claims to be included therein.

What is claimed is:

1. A thin film transistor substrate comprising:
an active pattern which is disposed on a base substrate and includes a channel, a source electrode and a drain electrode, wherein the channel includes an oxide semiconductor, and the source electrode and the drain electrode are connected the channel;

a gate electrode overlapped with the channel;

a passivation layer which covers the source electrode, the drain electrode and the gate electrode; and a fluorine deposition layer comprising:

a lower surface which contacts the source electrode and the drain electrode; and an upper surface which is opposite to the lower surface and contacts the passivation layer.

2. The thin film transistor substrate of claim 1, wherein the source electrode and the drain electrode comprise a metal reduced from the oxide semiconductor.

3. The thin film transistor substrate of claim 1, wherein the channel, the source electrode and the drain electrode are disposed in a same layer.

4. The thin film transistor substrate of claim 1, wherein the passivation layer comprises silicon nitride fluoride (SiNF).

5. The thin film transistor substrate of claim 1, wherein the oxide semiconductor comprises at least one selected from zinc oxide ("ZnO"), zinc tin oxide ("ZTO"), zinc indium oxide ("ZIO"), indium oxide ("InO"), titanium oxide ("TiO"), indium gallium zinc oxide ("IGZO") and indium zinc tin oxide ("IZTO").

6. The thin film transistor substrate of claim 1, wherein the fluorine deposition layer is a plasma gas-treated portion of the active pattern, and the gas includes fluorine to provide the fluorine deposition layer.

7. The thin film transistor substrate of claim 6, wherein the gas which includes fluorine comprises at least one selected from silicon tetrafluoride (SiF4), tetrafluoromethane (CF4), sulfur hexafluoride (SF6), octafluorocyclobutane (C4F8) and nitrogen trifluoride (NF3).

* * * * *